United States Patent
Ochs et al.

(10) Patent No.: US 9,568,818 B2
(45) Date of Patent: Feb. 14, 2017

(54) METHOD FOR PRODUCING A BLANK OF FLUORINE-DOPED AND TITANIUM-DOPED GLASS HAVING A HIGH SILICIC-ACID CONTENT AND A BLANK PRODUCED ACCORDING TO THE METHOD

(71) Applicant: Heraeus Quarzglas GmbH & Co. KG, Hanau (DE)

(72) Inventors: Stefan Ochs, Gelnhausen (DE); Klaus Becker, Hanau (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 14/862,707

(22) Filed: Sep. 23, 2015

(65) Prior Publication Data
US 2016/0085145 A1  Mar. 24, 2016

(30) Foreign Application Priority Data

Sep. 24, 2014 (EP) ..................... 14186139

(51) Int. Cl.
*C03C 3/06* (2006.01)
*G03F 1/22* (2012.01)
(Continued)

(52) U.S. Cl.
CPC ................. *G03F 1/22* (2013.01); *C03B 19/06* (2013.01); *C03B 19/14* (2013.01);
(Continued)

(58) Field of Classification Search
CPC ............. C03C 2201/02; C03C 2201/06; C03C 2201/08; C03C 2201/12; C03C 2201/23; C03C 3/06
See application file for complete search history.

(56) References Cited

U.S. PATENT DOCUMENTS 6,576,578 B1 * 6/2003 Ikuta ................... C03B 19/1415
501/54
6,849,114 B2 * 2/2005 Oswald ............... C01B 33/1417
106/286.4
(Continued)

FOREIGN PATENT DOCUMENTS

DE  102013108885 B3  8/2014
EP  2377826 A1  10/2011
(Continued)

OTHER PUBLICATIONS

Pfleiderer et al., "The UV-induced 210 nm absorption band in fused silica with different thermal history stoichiometry," Journal of Non-Crystalline Solids, vol. 159, pp. 145-153 (1993).
(Continued)

*Primary Examiner* — Noah Wiese
(74) *Attorney, Agent, or Firm* — Panitch Schwarze Belisario & Nadel LLP

(57) ABSTRACT

A method for producing a silica glass blank co-doped with titanium and fluorine for use in EUV lithography includes (a) producing a $TiO_2$—$SiO_2$ soot body by flame hydrolysis of silicon- and titanium-containing precursor substances, (b) fluorinating the $TiO_2$—$SiO_2$ soot body to form a fluorine-doped $TiO_2$—$SiO_2$ soot body, (c) treating the fluorine-doped $TiO_2$—$SiO_2$ soot body in a water vapor-containing atmosphere to form a conditioned soot body, and (d) vitrifying the conditioned soot body to form the blank. The blank has an internal transmission of at least 60% in the wavelength range of 400 to 700 nm at a sample thickness of 10 mm, a mean OH content in the range of 10 to 100 wt. ppm and a mean fluorine content in the range of 2,500 to 10,000 wt. ppm. Titanium is present in the blank in the oxidation forms $Ti^{3+}$ and $Ti^{4+}$.

16 Claims, 1 Drawing Sheet

(51) Int. Cl.
    *C03B 19/06*     (2006.01)
    *C03C 3/04*      (2006.01)
    *C03B 19/14*     (2006.01)
    *C03C 23/00*     (2006.01)
    *C03B 32/00*     (2006.01)
    *G03F 7/00*      (2006.01)

(52) U.S. Cl.
    CPC ...... *C03B 19/1453* (2013.01); *C03B 19/1461* (2013.01); *C03B 32/00* (2013.01); *C03C 3/04* (2013.01); *C03C 3/06* (2013.01); *C03C 23/00* (2013.01); *G03F 7/00* (2013.01); *C03B 2201/075* (2013.01); *C03B 2201/12* (2013.01); *C03B 2201/23* (2013.01); *C03B 2201/42* (2013.01); *C03C 2201/12* (2013.01); *C03C 2201/23* (2013.01); *C03C 2201/42* (2013.01); *C03C 2203/40* (2013.01); *C03C 2203/54* (2013.01)

(56) References Cited

U.S. PATENT DOCUMENTS

| | | | | |
|---|---|---|---|---|
| 7,419,924 | B2* | 9/2008 | Koike | C03B 19/1453 501/54 |
| 7,989,378 | B2* | 8/2011 | Koike | C03B 19/1453 501/54 |
| 8,590,342 | B2* | 11/2013 | Koike | B82Y 10/00 65/117 |
| 8,901,019 | B2* | 12/2014 | Annamalai | C03C 3/06 501/54 |
| 2006/0179879 | A1 | 8/2006 | Ellison et al. | |
| 2008/0053150 | A1* | 3/2008 | Moore | C03B 19/12 65/17.6 |
| 2010/0179047 | A1* | 7/2010 | Koike | C03B 19/1423 501/54 |
| 2014/0155246 | A1 | 6/2014 | Annamalai et al. | |

FOREIGN PATENT DOCUMENTS

| | | |
|---|---|---|
| EP | 2428488 A1 | 3/2012 |
| WO | 2004089836 A1 | 10/2004 |
| WO | 2006004169 A1 | 1/2006 |
| WO | 2009084717 A1 | 7/2009 |
| WO | 2015022152 A1 | 2/2015 |

OTHER PUBLICATIONS

Schoedel, "Ultra-high accuracy thermal expansion measurements with PTB's precision interferometer," Measurement Science and Technology, vol. 19, pp. 1-11 (2008).

Dodd et al., "Optical Determinations of OH in Fused Silica," Communications, p. 3911 (1966).

Search Report issued May 4, 2015 in EP Application No. 14186139.3.

K. Saito et al., "Effects of fluorine on structure, structural relaxation, and absorption edge in silica glass," Journal of Applied Physics, vol. 91, No. 8, pp. 4886-4890 (Apr. 15, 2002).

D.S. Carson et al., "Optical Attenuation in Titania-Silica Glasses," Journal of Non-Crystalline Solids, vol. 11, pp. 368-380 (1973).

* cited by examiner

METHOD FOR PRODUCING A BLANK OF FLUORINE-DOPED AND TITANIUM-DOPED GLASS HAVING A HIGH SILICIC-ACID CONTENT AND A BLANK PRODUCED ACCORDING TO THE METHOD

BACKGROUND OF THE INVENTION

The present invention refers to a method for producing a blank of titanium-doped glass having a high silicic acid content and an internal transmission of at least 60% in the wavelength range of 400 nm to 700 nm at a sample thickness of 10 mm, and with a given fluorine content for use in extreme ultraviolet (EUV) lithography.

Furthermore, the present invention refers to a blank of titanium-doped silica glass for use in EUV lithography.

In EUV lithography, highly integrated structures having a line width of less than 50 nm are produced by microlithographic projection devices. Radiation from the EUV range (extreme ultraviolet light, also called soft X-ray radiation) with wavelengths of about 13 nm is used. The projection devices are equipped with mirror elements which consist of titania-doped glass having a high silicic-acid content (hereinafter also called "$TiO_2$—$SiO_2$ glass" or "Ti-doped silica glass") and which are provided with a reflective layer system. These materials are distinguished by an extremely low linear coefficient of thermal expansion (shortly called "CTE"; coefficient of thermal expansion), which is adjustable through the concentration of titanium. Standard titania concentrations are between 6% by wt. and 9% by wt.

In the intended use of such blanks, which are made from synthetic titanium-doped glass having a high silicic-acid content, as a mirror substrate, the upper side thereof is provided with a reflective coating. The maximum (theoretical) reflectivity of such an EUV mirror element is about 70%, so that at least 30% of the radiation energy is absorbed in the coating or in the near-surface layer of the mirror substrate and converted into heat. In the volume of the mirror substrate, this leads to an inhomogeneous temperature distribution with temperature differences that, according to information given in the literature, may amount to 50° C.

Therefore, it would be desirable to provide a deformation that is as small as possible, if the glass of the mirror substrate blank had a CTE which is zero over the whole temperature range of the working temperatures arising during use. In Ti-doped silica glasses, however, the temperature range with a CTE of approximately zero can in actual fact be very narrow.

The temperature at which the coefficient of thermal expansion of the glass equals zero shall also be called zero crossing temperature or $T_{ZC}$ (temperature of zero crossing) hereinafter. The titanium concentration is normally set such that a CTE of zero is obtained in the temperature range between 20° C. and 45° C. Volume regions of the mirror substrate with a higher or lower temperature than the preset $T_{ZC}$ expand or contract so that, despite an altogether low CTE of the $TiO_2$—$SiO_2$ glass, deformations may arise that are detrimental to the imaging quality of the mirror.

In addition, the fictive temperature of the glass plays a role. The fictive temperature is a glass property that represents the state of order of the "frozen" glass network. A higher fictive temperature of the $TiO_2$—$SiO_2$ glass is accompanied by a lower state of order of the glass structure and by a greater deviation from the most energetically advantageous structural arrangement.

The fictive temperature is influenced by the thermal history of the glass, especially by the last cooling process. In the last cooling process, different conditions are bound to prevail for near-surface regions of a glass block as compared with the central regions, so that different volume regions of the mirror substrate blank already have different fictive temperatures due to their different thermal history. The fictive temperatures, in turn, correlate with correspondingly inhomogeneous regions with respect to the CTE curve. In addition, however, the fictive temperature is also influenced by the amount of fluorine, because fluorine has an impact on structural relaxation. Fluorine doping permits the adjustment of a low fictive temperature and, consequently, also a smaller slope of the CTE curve with respect to the temperature.

The Ti-doped silica glass is produced by flame hydrolysis, starting from precursor substances containing silicon and titanium. First of all, a porous soot body of titanium-doped $SiO_2$ is produced, which is vitrified into a dense glass body. Optionally, the soot body is subjected, prior to vitrification, to a drying process (e.g. by treatment in a halogen-containing atmosphere) for reducing the hydroxyl group content (OH group content). Doping with titanium oxide, however, leads to a brownish appearance or staining of the glass due to a more or less strong concentration of $Ti^{3+}$ ions in the glass matrix. The shaped bodies for this application, hereinafter also called blanks, are large, dark-brown plates with dimensions of up to about 70×60×20 $cm^3$. The blanks must be checked with respect to their optical properties and with respect to defects or inhomogeneity due to the manufacturing process. The brownish appearance of the glass has turned out to be problematic, since common optical measuring methods that presuppose transparence in the visible spectral range can only be used to a limited degree or cannot be applied at all.

The literature has proposed various solutions for limiting the amount of $Ti^{3+}$ ions in favor of $Ti^{4+}$ ions by way of an oxidation treatment. When a Ti-doped silica glass is used with a relatively high hydroxyl group content, the OH groups permit the desired oxidation of $Ti^{3+}$ into $Ti^{4+}$. This is, for example, described for Ti-doped silica glass by Carson and Mauer in "Optical Attenuation in Titania-Silica Glasses," J. Non-Crystalline Solids, Vol. 11(1973), pp. 368-380, which indicates a reaction according to formula $2Ti^{3+} + 2OH^- \rightarrow 2Ti^{4+} + 2O^{2-} + H_2$.

This procedure is adopted in European Patent Application Publication No. EP 2 428 488 A1, particularly with respect to optimized conditions for the process of oxidation and the out-diffusion of hydrogen during an annealing treatment. The Ti-doped silica glass disclosed in EP 2 428 488 A1 is not doped with fluorine, has a high OH content of more than 600 wt. ppm, and has a relatively low hydrogen content (less than $2 \times 10^{17}$ molecules/$cm^3$). To ensure a high OH content, the addition of water vapor during the deposition process is recommended. A two-stage deposition process is described in which $TiO_2$—$SiO_2$ soot particles are first formed that are subsequently consolidated and vitrified. A one-stage process is also described in which the soot particles are vitrified immediately (so-called "direct quartz" or "DQ method"). The amount of $Ti^{3+}$ ions in the Ti-doped silica glass is disclosed as being less than 3 ppm and the internal transmission over a wavelength range of 340 nm to 840 nm is disclosed as being greater than 90%. However, no information is provided about the thickness of the sample.

International Application Publication No. WO 2004/089836 A1 discloses a Ti-doped silica glass with a fluorine doping that exhibits a very flat slope of the coefficient of thermal expansion over a relatively wide temperature range. First, the porous $TiO_2$—$SiO_2$ soot body is predried in air at 1200° C., which entails a first reduction of the OH content and an oxidation of $Ti^{3+}$ ions. Subsequently, for fluorine doping, the $TiO_2$—$SiO_2$ soot body is exposed to an atmosphere with 10% by vol. of $SiF_4$ in oxygen or in helium for several hours. Apart from fluorine doping, this treatment entails a further reduction of the OH content. To prevent a dark coloration or staining during vitrification of the soot body, it is suggested in WO 2004/089836 A1 that the soot body should be treated prior to vitrification in an oxygen atmosphere for several hours in the temperature range between 300° C. and 1300° C., before the subsequent vitrification step is carried out under helium. The glass body of fluorine- and titanium-doped silica glass is then shaped into a blank and subjected to an annealing treatment for setting the fictive temperature. Information on the amount of $Ti^{3+}$ ions or on the dark staining or on the internal transmission is not provided in WO 2004/089836 A1.

International Application Publication No. WO 2006/004169 A1 resumes the examples of WO 2004/089836 A1 with respect to the amount of Ti3+ and the information on the internal transmission. The method according to WO 2006/004169 A1 also provides an oxygen treatment of a $TiO_2$—$SiO_2$ soot body with fluorine doping prior to vitrification (under helium.). Fluorine doping is carried out in an atmosphere containing oxygen and fluorine. The Ti-doped silica glass produced in this manner contains 10 wt. ppm OH groups and 12 wt. ppm $Ti^{3+}$ ions. The fluorine content is 120 wt. ppm and 6,300 wt. ppm, respectively. The internal transmission in the wavelength range of 400 nm to 700 nm is specified to be more than 80% in the case of this relatively high content of $Ti^{3+}$. However, this is for a glass thickness of only one millimeter. Converted to a sample with a thickness of 10 mm, this corresponds to a value for the internal transmission of only 10%.

The methods according to WO 2004/089836 A1 and WO 2006/004169 A1 are very complicated technically and do not yield an acceptable, sufficiently high internal transmission for realistic sample thicknesses in the range of 10 mm.

It is known from U.S. Patent Application Publication No. 2006/0179879 A1 that in a $TiO_2$—$SiO_2$ glass for use in EUV lithography, the CTE curve over the temperature obtained in the course of operation can be influenced, apart from a homogeneous distribution of the titanium concentration, by further parameters (e.g., by doping with fluorine and by the OH content). Fluorine may also serve as a drying reagent with which the OH content can be set to less than 100 ppm. Inversely, an OH content of up to 1500 ppm is achieved through the action of water vapor during vitrification. In one embodiment according to US 2006/0179879 A1, a fluorine-doped $TiO_2$—$SiO_2$ soot body is obtained by flame hydrolysis of precursor substances containing silicon, titanium and fluorine. In a subsequent process step, the soot body is vitrified or consolidated in an inert gas atmosphere containing water vapor. The fluorine content of the $TiO_2$—$SiO_2$ glass is in the range of 500 wt. pm to 2000 wt. ppm. No information is provided on the amount of the $Ti^{3+}$ ions in the $TiO_2$—$SiO_2$ glass, on the OH content and on the internal transmission in the visible wavelength range of this fluorine-doped $TiO_2$—$SiO_2$ glass.

Apart from the aforementioned embodiment, US 2006/0179879 A1 also generally discusses the production of quartz glass according to the so-called soot method under the heading "Soot Formation Followed by Consolidation." Thus, the $SiO_2$ soot body can be subjected, at about 1000° C., to a treatment with helium, hydrogen, water vapor or a doping gas, such as $CF_4$, in the case of a desired fluorine doping, before a subsequent vitrification step is carried out at a higher temperature. No information is provided on the impacts of the treatment with helium, hydrogen or water vapor on the $SiO_2$ soot body or on the sintered quartz glass. However, it must be assumed that, since a drying of the soot body prior to vitrification is obviously not intended, a high OH content is present in the soot body, which might even rise due to the water vapor-containing atmosphere and will lead to undesired bubbles during vitrification.

International Application Publication No. WO 2009/084717 A1, U.S. Patent Application Publication Nos. 2010/0179047 A1 and 2014/0155246 A1 and European Patent Application Publication No. 2 377 826 A1 are additional prior art publications regarding $TiO_2$—$SiO_2$ glass with fluorine-codoping.

In sum, according to the prior art, the reduction of $Ti^{3+}$ ions in favor of $T^{4+}$ ions in Ti-doped silica glass is ensured either by a sufficiently great amount of OH groups, whereby an internal oxidation with hydrogen diffusing out occurs, or at a low OH group content, wherein an oxygen treatment is required prior to vitrification. Such oxygen treatment demands a high treatment temperature and special corrosion-resistant furnaces, and is thus expensive.

In $TiO_2$—$SiO_2$ glass with F-codoping, the problems regarding brown coloration or staining caused by a high amount of $Ti^{3+}$ ions are especially significant because, due to fluorine, there are virtually no OH groups present which may induce an oxidation of $Ti^{3+}$ into $Ti^{4+}$.

Moreover, it has been found that although the known oxygen treatment prior to vitrification reliably increases the amount of oxygen, whereby oxidation occurs once in favor of $Ti^{4+}$ ions, this measure is not permanent, for instance, when the vitrified blank is shaped under a reducing atmosphere (e.g. by applying an oxyhydrogen flame adjusted in a reducing manner). This means that, due to the oxygen treatment, the oxygen is available only once for the oxidation of $Ti^{3+}$ to $Ti^{4+}$, so that under reducing conditions, $Ti^{3+}$ ions are increasingly formed again, which is known to lead to the dark appearance or staining of the glass.

BRIEF SUMMARY OF THE INVENTION

It is therefore an objective of the present invention to provide an inexpensive manufacturing method for glass which is doped with titanium and fluorine, which has a high silicic-acid content, and which, at an OH content of less than 100 wt. ppm, exhibits an internal transmission at a sample thickness of 10 mm of at least 60% in the wavelength range of 400 nm to 700 nm. According to the present invention, after the action of the reducing atmosphere on the glass, the OH groups show a prolonged action period in the sense of a depot for the internal oxidation of $Ti^{3+}$ into $Ti^{4+}$ ions.

Furthermore, it is an objective of the present invention to provide such a silica glass blank which is co-doped with titanium and fluorine.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

DETAILED DESCRIPTION OF THE INVENTION

Figure 1:
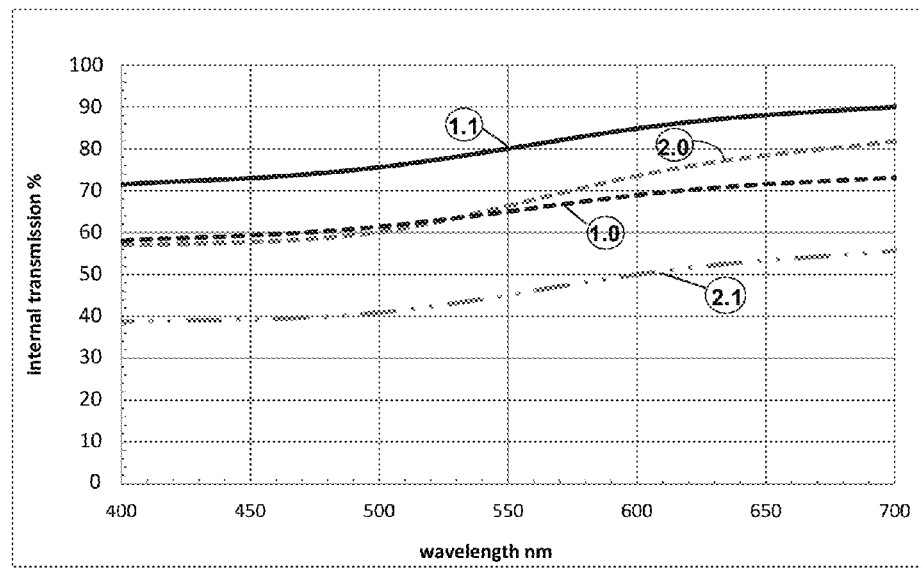
FIG. 1 shows a diagram of the internal transmission of a blank produced by a method, before and after shaping steps under a reducing atmosphere, in accordance with an embodiment of the present invention.

In one embodiment, the method according to the present invention comprises the following method steps:

(a) producing a $TiO_2$—$SiO_2$ soot body by flame hydrolysis of silicon- and titanium-containing precursor substances, (b) fluorinating the soot body so as to form a fluorine-doped $TiO_2$—$SiO_2$ soot body, (c) treating the fluorine-doped $TiO_2$—$SiO_2$ soot body in a water vapor-containing atmosphere so as to form a conditioned soot body, and (d) vitrifying the conditioned soot body so as to form a blank of titanium-doped glass having a high silicic-acid content, a mean hydroxyl group content in the range of 10 wt. ppm to 100 wt. ppm and a mean fluorine content in the range of 2,500 wt. ppm to 10,000 wt. ppm.

In the production of synthetic Ti-doped silica glass according to the so-called "soot method" by flame hydrolysis, $SiO_2$ and $TiO_2$ particles produced in the flame by hydrolysis or oxidation are first deposited on a deposition surface while forming a $TiO_2$—$SiO_2$ soot body (method step (a)). As an alternative to the "soot method," according to the present invention, Ti-doped silica glass may also be produced according to the one-stage "direct method" in which the deposited $SiO_2$ and $TiO_2$ particles are directly vitrified, an increased OH content in the range of about 450 to 1200 wt. ppm being typically obtained. The Ti-doped silica glass produced according to the direct method is, however, generally not the subject of the present invention.

In the further method step (b), the soot body is doped with fluorine, so that a fluorine content in the range of 2500 wt. ppm to 10,000 wt. ppm is set in the vitrified blank. The hydroxyl groups are substantially removed by fluorination. This state has the drawback that there are no longer any hydroxyl groups for the oxidation of $Ti^{3+}$ into $Ti^{4+}$ and that an intense brown coloration or staining of the blank made from fluorine-doped $TiO_2$—$SiO_2$ glass has to be expected.

For the lasting prevention or at least reduction of the brown staining, the fluorination of the $TiO_2$—$SiO_2$ soot body with method step (c) is followed by a conditioning treatment in an atmosphere containing water vapor, whereby a conditioned soot body is obtained with an amount of hydroxyl groups that is sufficient for the oxidation of $Ti^{3+}$ into $Ti^{4+}$.

The conditioned soot body is subsequently vitrified while forming a blank of titanium-doped glass having a high silicic acid content and an OH content in the range of 10 wt. ppm to 100 wt. ppm (method step (d)).

A central idea of the method according to the present invention lies in reducing the concentration of $Ti^{3+}$ ions in favor of $Ti^{4+}$ prior to vitrification in the $TiO_2$—$SiO_2$ soot body, by an oxidative conditioning treatment with water vapor. The conditioning treatment with water vapor is carried out before the vitrification step, because an open-pored soot body into which hydroxyl groups can easily be incorporated is still present in this stage. The incorporation of the hydroxyl groups is here carried out such that, with respect to the internal oxidation of $Ti^{3+}$ into $Ti^{4+}$, the hydroxyl groups have a depot effect for the subsequent method steps that take place under reducing conditions. A particularly homogeneous distribution of the hydroxyl groups within the soot body is also obtained in the conditioning treatment. The fluorine ligands bonded within the glass particles are here substantially maintained, so that the method according to the present invention yields a $TiO_2$—$SiO_2$ blank which is doped with fluorine and, at the same time, has a sufficiently high OH content to ensure the oxidation of $Ti^{3+}$ into $Ti^{4+}$.

Due to the conditioning treatment, OH groups are incorporated as a depot into the soot body so that they are available for internal oxidation not only once, but are also effective after application of reducing conditions in subsequent method steps, in the sense of a renewed internal oxidation during a relatively short temperature treatment lasting for a few days, depending on the volume of the blank, in the range between 600° C. and 1000° C., normally in air or in vacuum, which in turn leads to a minimized amount of $Ti^{3+}$ ions.

The Ti-doped silica glass to be produced according to the method of the present invention contains titanium dioxide in the range of 6% by wt. to 12% by wt., which corresponds to a titanium content of 3.6% by wt. to 7.2% by wt. In the $TiO_2$—$SiO_2$ soot body, the titanium is present at least in part in the oxidation form $Ti^{3+}$. A state is desired where all $Ti^{3+}$ ions are converted into $Ti^+$ ions, if possible, so that there is no objectionable absorption in the wavelength range of 400 nm to 1000 nm due to $Ti^{3+}$ ions, and the Ti-doped silica glass thereby shows maximum transparence in this wavelength range. Since, due to fluorination doping, the soot body is without OH groups or only has a small amount (<10 wt. ppm) of OH groups, such groups can hardly make any contribution to the oxidation of $Ti^{3+}$ to $T^{4+}$. As an oxidative treatment reagent, a conditioning treatment with a water vapor-containing atmosphere is carried out according to the present invention before the vitrification steps. The open-pored soot body also reacts at a relatively low temperature with water vapor, so that $Ti^{3+}$ ions are converted into $Ti^{4+}$ ions. The OH groups are incorporated as Si—OH groups into the glass network. The OH groups are still available after treatment in a reducing atmosphere in subsequent method steps, such as shaping in a graphite furnace, for the internal oxidation of $Ti^{3+}$ to $Ti^{4+}$.

When the water vapor is only used during vitrification, as in the case of the prior art, its effect is rather small and irregular with respect to the reaction of the OH groups with the $Ti^{3+}$ ions, so that its inner surface and outer surface are gradually shrinking, whereby penetration and reaction of the OH groups from the water vapor is impeded. It must rather be expected that the water vapor leads to the formation of bubbles in the glass, which is not acceptable for a method for producing a blank from titanium-doped glass having a high silicic acid content.

In comparison with the treatment of the $TiO_2$—$SiO_2$ soot body in an oxygen atmosphere, as is known from the prior art, the conditioning treatment with water vapor is not very complicated in terms of technology and energy in the method according to the present invention. With the method according to the present invention, it is possible to carry out the conditioning treatment in glass or ceramic furnaces that are also used for drying and vitrifying the soot body in vacuum or/and in a noble gas environment. The method according to the present invention is thus particularly economic. Moreover, it is advantageous to set an OH content between 10 wt. ppm and 100 wt. ppm, because this leads to a particularly high homogeneity of the CTE and of the fictive temperature. At an OH content of more than 100 ppm, the distribution of the OH groups is thus irregular and the formation of bubbles in the glass must even be expected at a particularly high OH content.

Also, in comparison with a conditioning treatment with nitrogen oxides, which also yield the desired oxidation of $Ti^{3+}$ into $Ti^{4+}$, as is disclosed in DE 10 2013 108 885 B2, the method of the present invention using water vapor is preferred because most nitrogen oxides are toxic and rather harmful to the environment and, moreover, require a higher temperature than water vapor for an efficient use. Water vapor has a special advantage in that it is available in high purity form on a large industrial scale and is harmless.

Upon decomposition of water vapor, reactive OH groups are formed that already react at a relatively low temperature with the $Ti^{3+}$ ions. The reaction of $Ti^{3+}$ ions with water vapor is carried out according to the following reaction equation (1) with release of water vapor ($H_2$):

$$2Ti^{3+} + H_2O \rightarrow 2Ti^{4+} + O^{2-} + H_2 \qquad (1)$$

The OH groups introduced by the conditioning treatment with water vapor into the silica glass doped with fluorine and titanium induce an internal oxidation of the $Ti^{3+}$ ions into $Ti^{4+}$ ions not only once, but are also available for a renewed internal oxidation (depot effect) if a reducing atmosphere acts on the vitrified blank at a high temperature and $Ti^{3+}$ ions that deteriorate the internal transmission of the blank are formed in this process again.

Thus, it has been found useful for this situation that, when the blank after vitrification according to method step (d) is subjected to a treatment in a reducing atmosphere and the ratio $Ti^{3+}/Ti^{4+}$ is increased with reduction of the internal transmission in the wavelength range 400 nm to 700 nm, the blank is subsequently subjected to an annealing treatment at a temperature in the range between 600° C. and 1000° C. to reverse the reduction of the internal transmission. An impact of the reducing atmosphere is, for example, observed during shaping of the blank in a graphite mold and leads to a brown staining of the blank due to the reduction of $Ti^{4+}$ ions to $Ti^{3+}$ ions. The brown staining can largely be eliminated again by the annealing treatment, for instance in air or in vacuum, at a temperature within the range between 600° C. and 1000° C., because the OH groups incorporated in the glass are available for the renewed internal oxidation of $Ti^{3+}$ and thereby set the ratio of $Ti^{3+}/Ti^{4+} \leq 2 \times 10^{-4}$. This annealing treatment is not concerned with the action of a gas on the blank, but with the out-diffusion of hydrogen according to formula (1) as a reaction product of the renewed internal oxidation.

Moreover, it has been found to be useful that the conditioning treatment with water vapor is carried out at a treatment temperature in the range of 100° C. to 1100° C., and preferably in the range of 500° C. to 1000° C., for a duration of one (1) hour to 40 hours.

Since the conditioning treatment may already be carried out at a temperature of 100° C., an oxidation of the $Ti^{3+}$ ions is possible with a relatively small amount of energy being consumed. Hence, this requires only the use of furnaces of a rather simple design and this treatment phase can be easily carried out repeatedly. At temperatures below about 1100° C., the porous structure of the soot body is maintained, so that it is ensured that the gaseous treatment reagents can penetrate the soot body by diffusion and uniformly react with the $Ti^{3+}$ ions distributed in the glass network. At a relatively low temperature in the range between 100° C. and 500° C., the infiltration of the soot body with water vapor requires a correspondingly long treatment period until the desired oxidative reaction with $Ti^{3+}$ ions occurs, with the hydroxyl groups from the water vapor accumulating on the surface of the individual soot particles. Depending on the treatment temperature, the treatment period also depends on the volume of the soot body. A minimum treatment period of at least one hour has been found to be adequate for ensuring an efficient infiltration of the soot body with water vapor. A substantially uniform distribution of the treatment gas within the porous soot body is thereby achieved. The water vapor may be introduced by an inert carrier gas stream into the soot body.

Advantageously, the amount of the water vapor in inert gas during the conditioning treatment is 0.05 to 50 vol. %, preferably 1 to 20 vol. %.

With water-vapor fractions below 0.05 vol. %, the oxidative effect will be low and with water vapor fractions above 50 vol. %, surface water may form on the soot body, which is in principle not harmful, but must be removed again before vitrification.

It has been found to be useful to carry out drying after production of the $TiO_2$—$SiO_2$ soot body and before fluorination according to method step (b), resulting in a mean OH content of less than 10 wt. ppm. With this dehydration treatment, water accumulated in the soot body is removed, which permits a particularly homogeneous distribution of the fluorine in the subsequent fluorination step. Drying may be carried out purely thermally in inert gas, dry air or under vacuum in the temperature range between 700° C. to 1100° C. Alternatively, the use of a drying reagent such as chlorine is also standard. The drying step effects a reduction of the OH content to less than 10 wt. ppm. After the drying step, the $TiO_2$—$SiO_2$ soot body is fluorine-doped, resulting in a further drying effect. Hence, the OH content of the soot body is less than 1 wt. ppm which, in this state, entails a high amount of $Ti^{3+}$ ions of 20 ppm to 30 ppm. If such a soot body is vitrified without further treatment, the blank shows an intense dark staining.

Fluorine has an influence on the structural relaxation of silica glass, so that the fictive temperature as a measure of the state of order of the "frozen" glass network can be lowered for the Ti-doped silica glass and the temperature range can be enlarged with a coefficient of thermal expansion of zero. This is, for example, known from the Journal of Applied Physics, Vol. 91 (8), April 2002, pp. 4886-4890. Depending on the treatment duration and temperature, a fluorine concentration between 2,500 wt.-ppm and 10,000 wt.-ppm, preferably between 5,000 wt.-ppm and 10,000 wt.-ppm, is set in the blank.

A further advantageous configuration of the present invention is in performing the fluorine treatment of the $TiO_2$—$SiO_2$ soot body according to method step (b) in a fluorine-containing atmosphere which preferably contains 2 vol. % to 100 vol. % $SiF_4$. In principle, pure fluorine gas ($F_2$) or $SiHF_3$ or $SiH_2F_2$ may be used instead of $SiF_4$.

The use of carbon-containing fluorinating gases such as $CHF_3$, $CF_4$, $C_2F_6$ or $C_3F_8$ is rather unfavorable due to their reducing action, because this would support the formation of undesired $Ti^{3+}$ ions.

Moreover, it is advantageous when the fluorination according to method step (b) is carried out in a temperature range of 700° C. to not more than 1000° C. With fluorination in this temperature range, the porous soot body is easily permeable to the fluorine-containing treatment gas, whereby an efficient incorporation of fluorine into the glass network is ensured.

For a particularly flat curve of the coefficient of thermal expansion of zero over a temperature range of 20° C. to 50°

C., the fluorine-doped $TiO_2$—$SiO_2$ blank advantageously has a mean fluorine content in the range of 2,500 to 10,000 wt. ppm.

As for the blank of Ti-doped glass having a high silicic acid content, the blank is preferably produced according to the following method steps: (a) producing a $TiO_2$—$SiO_2$ soot body by flame hydrolysis of silicon- and titanium-containing precursor substances, (b) fluorinating the soot body so as to form a fluorine-doped $TiO_2$—$SiO_2$ soot body, (c) treating the fluorine-doped $TiO_2$—$SiO_2$ soot body in a water vapor-containing atmosphere so as to form a conditioned soot body, and (d) vitrifying the conditioned soot body so as to form the blank of titanium-doped glass having a high silicic-acid content, and which is distinguished by a mean fluorine content in the range of 2,500 wt. ppm to 10,000 wt. ppm, a mean OH content in the range of 10 wt. ppm to 100 wt. ppm, and a mean $TiO_2$ content in the range of 6% by wt. to 12% by wt., wherein titanium is present in the oxidation forms $Ti^{3+}$ and $Ti^{4+}$, and the ratio of $Ti^{3+}/Ti^{4+}$ is adjusted to a value of $\leq 2\times 10^{-4}$.

Due to its small amount of $Ti^{3+}$ ions, the blank according to the present invention exhibits high transparence of more than 60% in the wavelength range of 400 nm to 700 nm for a sample with a thickness of 10 mm. The inspection of the blank with standard optical measuring methods is thereby possible without difficulty.

The concentration of $Ti^{3+}$ can be determined by an electron spin resonance measurement as is, for example, mentioned in the above-mentioned publication of Carson and Mauer.

Furthermore, the blank of Ti-doped silica glass is fluorine-doped. For the purpose of a particularly flat curve of the coefficient of thermal expansion of zero over a temperature range of 20° C. to 50° C., the fluorine content is in the range of 5,000 wt. ppm to 10,000 wt. ppm.

The mean fluorine concentration is normally determined in a wet-chemical process. A measurement sample of the blank according to the present invention is first dissolved in an aqueous NaOH solution. The F concentration is obtained by measurement of the electromotive force of the dissolved measurement sample by a fluorine-sensitive electrode.

The mean hydroxyl group content (OH content) follows from a measurement of the IR absorption, according to the method of D. M. Dodd et al., "Optical Determinations of OH in Fused Silica," p. 3911 (1966).

Moreover, the blank produced according to the method of the present invention exhibits a very favorable evolution of the coefficient of thermal expansion CTE with a small slope in the temperature range of 20° C. to 40° C. The CTE slope, expressed as a differential quotient dCTE/dt, is below 1.0 ppb/$K^2$. Moreover, such a blank produced according to the method of the present invention from silica glass doped with fluorine and titanium is distinguished by a particularly high homogeneity of the dopant distribution. This optimizes the local curve of the CTE over the optically used area, also called "CA area" (clear aperture).

In the blank produced according to the present invention, a relatively low fictive temperature is additionally detected, which is promoted by fluorine doping.

The blank produced according to the present invention is optimally qualified for use in EUV lithography. Also owing to its transparence in the visible spectral range, an optimal inspection prior to further processing steps, for example, to obtain a mirror substrate, is possible. Owing to the depot effect of the OH groups incorporated by the water vapor treatment, transparence in the visible spectral range is substantially maintained after repeated treatment steps in a reducing atmosphere, or may be reestablished or even may be surpassed as compared with the initial value after a particularly intensive reducing after treatment by annealing in the range between 600° C. and 1000° C. in air or under vacuum.

Example 1

A soot body is produced by flame hydrolysis of octamethylcyclotetrasiloxane (OMCTS) and titanium-isopropoxide [$Ti(OPr^i)_4$] with the assistance of a known "outside-vapor-deposition (OVD) method. The soot body consists of synthetic silica glass doped with 8 wt. % $TiO_2$.

This $TiO_2$—$SiO_2$ soot body is then subjected to a combined drying and doping treatment in an atmosphere containing 50 vol. % $SiF_4$. This treatment is carried out at a temperature of 900° C. for a period of 10 hours, and leads to a firm incorporation of fluorine into the $TiO_2$—$SiO_2$ soot body to be vitrified. A treatment period of 3 hours was applied for the subsequent conditioning treatment in water vapor-containing atmosphere with 2 vol. % $H_2O$ at a temperature of 800° C.

The fluorinated $TiO_2$—$SiO_2$ soot body treated with water vapor is subsequently vitrified in a sintering furnace at a temperature of about 1400° C. in helium or under vacuum (at about $10^{-2}$ mbar) for a period of 5 hours into a transparent Ti-doped silica glass blank in the form of a rod. This blank shows a very small amount of $Ti^{3+}$ ions of only about 6 wt. ppm and is distinguished by a mean fluorine content of 6,000 wt. ppm and by an OH content of 60 wt. ppm. In a first measurement of the internal transmission in the wavelength range of 400 nm to 700 nm on a sample with a sample thickness of 10 mm (see FIG. 1, curve 1.0), the values are within the range of 60% to 70%.

The vitrified blank is subsequently homogenized by thermal-mechanical homogenization by twisting under the action of a reducing oxyhydrogen flame. The rod-shaped blank assumes a barrel-like shape and shows a slightly increased brown staining, which is accompanied by a transmission value in the visible spectral range (sample thickness 10 mm) of about 50%.

This is followed by a further shaping process into a cylindrical shaped body. The blank is put into a fusion mold of graphite that has a bottom with a round or polygonal cross-section and outer dimensions of about 300 mm. For the shaping process, the whole fusion mold with the blank positioned therein is first heated to 1250° C. and subsequently with a ramp of 9° C./min to 1600° C., and then with a ramp of 2° C./min to a temperature of 1680° C. The silica glass mass will be kept at this temperature until the softened Ti-doped silica glass has flown out under the action of its own weight into the bottom of the fusion mold, thereby filling the mold. A round or polygonal plate with a thickness of about 60 mm is formed from the blank, the plate being without layers and striae in all of the three viewing directions. After the shaping steps in a reducing atmosphere, an amount of 9 wt. ppm $Ti^{3+}$ or a ratio of $Ti^{3+}/Ti^{4+}$ of about $2.5\times 10^{-4}$ is detected in the blank. The internal transmission in the visible spectral range on a sample of the blank with a thickness of 10 mm is in the range between about 40% and 50%.

To reduce mechanical strains and to avoid birefringence, the Ti-doped silica glass blank is subjected to an annealing treatment in which the cylindrical blank is heated for a holding period of 8 hours in air and at an atmospheric pressure to 950° C., and is subsequently cooled down at a cooling rate of 1° C./h to a temperature of 700° C. and held at that temperature for 4 hours. Cooling down to 300° C. at an increased cooling rate of 50° C./h is subsequently carried out, whereupon the furnace is switched off and the blank is allowed to cool freely in the furnace. After this annealing temperature, a mean fictive temperature ($T_f$) of 800° C. is obtained.

A standard measuring method for determining the fictive temperature with the help of a measurement of the Raman scattering intensity at a wave number of about 606 cm$^{-1}$ is described in Ch. Pfleiderer et. al., "The UV-induced 210 nm absorption band in fused silica with different thermal history and stoichiometry," Journal of Non-Cryst. Solids 159, pp. 143-145 (1993).

Owing to the annealing treatment in air, the depot effect of the OH groups incorporated by the conditioning treatment with water vapor is activated, so that the blank seems to be even brighter again than initially after vitrification. According to FIG. 1, curve 1.1, the internal transmission of the blank produced according to the present invention is 80% on average.

Internal transmission stands for the transmission over the sample thickness corrected by the amount of losses at the surface.

Moreover, for the blank produced according to the method of the present invention, the mean coefficient of thermal expansion is determined by interferometry, such as by the method as described in: R. Schödel, "Ultra-high accuracy thermal expansion measurements with PTB's precision interferometer," Meas. Sci. Technol. 19 084003, 11 pp (2008).

In the blank produced according to the present invention, a zero crossing temperature ($T_{ZC}$) of 28° C. and a CTE slope of 0.8 ppb/K$^2$ are determined Since the blank in its edge portions shows a relatively strong stress birefringence, a part of the oversize as compared with the component contour is removed from the front faces, namely a thickness of 3 mm. The blank is distinguished on account of a ratio $Ti^{3+}/Ti^{4+}$ of $0.7\times10^{-4}$ by high transparence in the visible spectral range and can now be inspected with the standard optical measuring methods and subjected to further processing steps according to the obtained measurement results.

Figure 2:
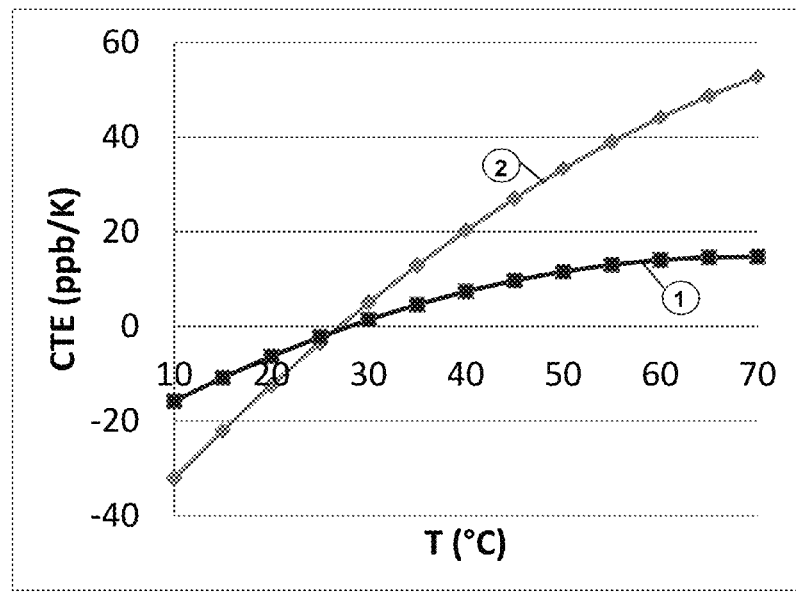
FIG. 2 shows a diagram of the CTE curve against temperature (10° C. to 70° C.), in accordance with an embodiment of the present invention.

The diagram of FIG. 2 shows the coefficient of thermal expansion CTE as a function of the temperature. A particularly flat profile of the CTE for the fluorine-doped $TiO_2$—$SiO_2$ blank produced according to the method of the present invention is evident from curve 1. The gradient of CTE is 0.8 ppb/K$^2$ at a zero crossing temperature of 28° C.

Comparative Example 1

Under the conditions as explained in detail with respect to Example 1, a $TiO_2$—$SiO_2$ soot body is produced and subjected to a combined drying and doping treatment in an atmosphere containing 20 vol. % $SiF_4$. This treatment is carried out at a temperature of 900° C. and for a period of 10 hours, and leads to a firm incorporation of fluorine into the $TiO_2$—$SiO_2$ soot body to be vitrified. This treatment is then followed by an oxygen treatment in which an atmosphere of 100% oxygen acts under normal pressure on the soot body for four hours at 1000° C. Vitrification is then carried out at 1550° C. in helium atmosphere.

The blank obtained thereby has an OH content of less than 1 wt. ppm (below the detection limit), but due to the favorable ratio of $Ti^{3+}$ to $T^{4+}$ of $2\times10^{-4}$, does not yet show good transmission values between about 60% and 75% in the visible spectral range, as shown in FIG. 1, curve 2.0. This blank must now be homogenized and shaped. These subsequent method steps are carried out under a reducing atmosphere. Already after homogenization, an intense brown staining of the blank can be detected, which is even intensified in the subsequent shaping process. An annealing treatment at 1000° C. in air does not change this brown staining. Due to the reducing atmosphere prevailing during homogenization and shaping, the ratio $Ti^{3+}/Ti^{4+}$ is shifted in favor of $Ti^{3+}$ ions and is then about $2.5\times10^{-4}$. Thus a sample piece of the blank with a thickness of 10 mm exhibits an irreversible decrease in the internal transmission to values of about 45%, as follows from FIG. 1, curve 2.1 This property cannot be improved by way of the annealing treatment in air, as virtually no oxygen can now penetrate into the vitrified blank within a realistic period of time so as to be available for renewed oxidation of $Ti^{3+}$ into $Ti^{4+}$. The comparative material V1 produced according to Comparative Example 1 is thus no longer qualified for use in EUV lithography. Hence, the oxygen treatment before vitrification does not lead to an incorporation of oxygen in the sense of a depot effect, in contrast to the method according to the present invention which includes a conditioning treatment with water vapor.

As for the curve of the coefficient of thermal expansion CTE as a function of the temperature, FIG. 2 does not show a change to curve 1 of Example 1 for the comparative material V1, because the CTE curve is substantially defined by the titanium and fluorine content, which is the same in Comparative Example 1 and in Example 1 according to the present invention.

Comparative Example 2

Under the conditions as explained in detail with respect to Example 1, a $TiO_2$—$SiO_2$ soot body is produced which, however, only comprises a $TiO_2$ content of 7.4 wt. %. The $TiO_2$—$SiO_2$ soot body is vitrified without a drying step and without a fluorine treatment. A conditioning treatment with water vapor or with oxygen is also omitted. After vitrification, the blank contains an OH content of 250 wt. ppm. This rather high OH content leads to relatively high transmission values of 65% prior to the shaping and even 85% after shaping and annealing with a correspondingly small ratio $Ti^{3+}/Ti^{4+}$. The values for the internal transmission alone are, however, not decisive for qualification in EUV lithography. Rather, the CTE curve and the fictive temperature must also be considered.

The CTE curve is determined after homogenization, shaping and annealing, as described in Example 1. In FIG. 2, curve 2 shows a very steep CTE profile over the temperature for this comparative material V2. The gradient of CTE is 1.6 ppb/K$^2$ in this case at a zero crossing temperature of 28° C. The fictive temperature ($T_f$) is 930° C. because of the absence of fluorine.

The essential properties of the blank produced according to the method of the present invention according to Example 1, as compared with the comparative material V1 and V2 of the Comparative Examples 1 and 2 are summarized in the following table.

TABLE 1

| Properties | Blank from method of the present invention (Example 1) | Comparative material V1 (Comparative Example 1) | Comparative material V2 (Comparative Example 2) |
|---|---|---|---|
| Titanium dioxide content [wt.-%] | 8.0 | 8.0 | 7.4 |
| Fluorine content [wt. ppm] | 6,000 | 6,000 | 0 |
| Conditioning treatment | Water vapor | Oxygen | — |
| OH content [wt. ppm] | 60 | <1 | 250 |
| Fictive temperature [° C.] | 800 | 800 | 930 |
| Int. transmission before shaping [%] | ~60 | ~60 | ~65 |
| $Ti^{3+}/Ti^{4+}$ before shaping $[10^{-4}]$ | 1.7 | 1.7 | 1.4 |
| Int. transmission after shaping and annealing [%] | ~80 | ~45 | ~85 |
| $Ti^{3+}/Ti^{4+}$ after shaping and annealing $[10^{-4}]$ | <0.7 | 2.5 | 0.5 |
| $\Delta CTE/\Delta T$ [ppb/$K^2$] | 0.8 | 0.8 | 1.6 |
| Suitability for use in EUV lithography | Very good | Moderate to poor | poor |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for producing a blank of titanium-doped glass having a high silicic acid content, an internal transmission of at least 60% in a wavelength range of 400 nm to 700 nm at a sample thickness of 10 mm, and a given fluorine content for use in extreme ultraviolet lithography, the titanium being present in oxidation forms $Ti^{3+}$ and $Ti^{4+}$, the method comprising the steps of:
   (a) producing a $TiO_2$—$SiO_2$ soot body by flame hydrolysis of silicon- and titanium-containing precursor substances;
   (b) fluorinating the $TiO_2$—$SiO_2$ soot body to form a fluorine-doped $TiO_2$—$SiO_2$ soot body;
   (c) treating the fluorine-doped $TiO_2$—$SiO_2$ soot body in a water vapor-containing atmosphere to form a conditioned soot body; and
   (d) vitrifying the conditioned soot body to form a blank of titanium-doped glass having a high silicic-acid content, a mean OH content in the range of 10 wt. ppm to 100 wt. ppm and a mean fluorine content in the range of 2,500 to 10,000 wt. ppm;
   (e) subjecting the blank to a treatment in a reducing atmosphere in which a ratio of $Ti^{3+}/Ti^{4+}$ is increased, while the internal transmission in the wavelength range 400 nm to 700 nm is reduced; and
   (f) subsequently subjecting the blank to an annealing treatment at a temperature in the range between 600° C. and 1000° C. to undo the reduction of the internal transmission.

2. The method according to claim 1, wherein the step (c) is carried out at a treatment temperature in the range of 100° C. to 1000° C. and for a duration of 1 to 10 hours.

3. The method according to claim 2, wherein the treatment temperature is in the range of 500° C. to 1000° C.

4. The method according to claim 1, wherein in the step (c), an amount of the water vapor in an inert gas is between 0.05% by vol. and 50% by vol.

5. The method according to claim 4, wherein the amount of the water vapor in the inert gas is between 1 and 20% by vol.

6. The method according to claim 1, wherein prior to the step (b), drying is performed to set the mean OH content to less than 10 wt. ppm.

7. The method according to claim 1, wherein the step (b) is carried out in a fluorine-containing atmosphere containing 2% by vol. to 100% by vol. of $SiF_4$.

8. The method according to claim 1, wherein the step (c) is carried out in a temperature range of 700° C. to not more than 1000° C.

9. A method for producing a blank of titanium-doped glass having a high silicic acid content, an internal transmission of at least 60% in a wavelength range of 400 nm to 700 nm at a sample thickness of 10 mm, and a given fluorine content for use in extreme ultraviolet lithography, the titanium being present in oxidation forms $Ti^{3+}$ and $Ti^{4+}$, the method comprising the steps of:
   (a) producing a $TiO_2$—$SiO_2$ soot body by flame hydrolysis of silicon- and titanium-containing precursor substances;
   (b) fluorinating the $TiO_2$—$SiO_2$ soot body to form a fluorine-doped $TiO_2$—$SiO_2$ soot body;
   (c) treating the fluorine-doped $TiO_2$—$SiO_2$ soot body in a water vapor-containing atmosphere to form a conditioned soot body; and
   (d) vitrifying the conditioned soot body to form a blank of titanium-doped glass having a high silicic-acid content, a mean OH content in the range of 10 wt. ppm to 100 wt. ppm and a mean fluorine content in the range of 2,500 to 10,000 wt. ppm,
   wherein prior to the step (b), drying is performed to set the mean OH content to less than 10 wt. ppm.

10. The method according to claim 9, further comprising:
   (e) subjecting the blank to a treatment in a reducing atmosphere in which a ratio of $Ti^{3+}/Ti^{4+}$ is increased, while the internal transmission in the wavelength range 400 nm to 700 nm is reduced; and
   (f) subsequently subjecting the blank to an annealing treatment at a temperature in the range between 600° C. and 1000° C. to undo the reduction of the internal transmission.

11. The method according to claim 9, wherein the step (c) is carried out at a treatment temperature in the range of 100° C. to 1000° C. and for a duration of 1 to 10 hours.

12. The method according to claim 11, wherein the treatment temperature is in the range of 500° C. to 1000° C.

13. The method according to claim 9, wherein in the step (c), an amount of the water vapor in an inert gas is between 0.05% by vol. and 50% by vol.

14. The method according to claim 13, wherein the amount of the water vapor in the inert gas is between 1 and 20% by vol.

15. The method according to claim 9, wherein the step (b) is carried out in a fluorine-containing atmosphere containing 2% by vol. to 100% by vol. of $SiF_4$.

16. The method according to claim 9, wherein the step (c) is carried out in a temperature range of 700° C. to not more than 1000° C.

* * * * *